United States Patent
Keng

(10) Patent No.: US 7,030,487 B1
(45) Date of Patent: Apr. 18, 2006

(54) CHIP SCALE PACKAGING WITH IMPROVED HEAT DISSIPATION CAPABILITY

(75) Inventor: I-Cheng Keng, Taipei Hsien (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 0 days.

(21) Appl. No.: 10/908,633

(22) Filed: May 20, 2005

(30) Foreign Application Priority Data

Feb. 2, 2005 (TW) ............................ 94103231 A

(51) Int. Cl.
*H01L 23/34* (2006.01)

(52) U.S. Cl. .................... 257/713; 257/720; 257/738

(58) Field of Classification Search ................ 257/712, 257/713, 720, 738
See application file for complete search history.

(56) References Cited

U.S. PATENT DOCUMENTS

| | | | |
|---|---|---|---|
| 6,479,321 B1 * | 11/2002 | Wang et al. | 438/109 |
| 6,563,712 B1 * | 5/2003 | Akram et al. | 361/719 |
| 6,569,712 B1 * | 5/2003 | Ho et al. | 438/121 |
| 6,818,538 B1 * | 11/2004 | Chiang et al. | 438/611 |

* cited by examiner

*Primary Examiner*—T. N. Quach
(74) *Attorney, Agent, or Firm*—Winston Hsu

(57) ABSTRACT

A chip scale packaging with improved heat dissipation capability is disclosed. A chip or die is adhered to the first surface of a packaging substrate having a plurality of metalized through holes thereon. A functional solder ball array is implanted on the second surface of the packaging substrate. Heat-dissipating solder balls are implanted around the functional solder ball array on the second surface of the packaging substrate. The heat-dissipating solder balls are connected to the metalized through holes. The bonding pads of the chip are bonded through a central window to the corresponding bonding pads on the second surface of the packaging substrate.

7 Claims, 3 Drawing Sheets

⇨ Heat dissipating path

⇨ Heat dissipating path

CHIP SCALE PACKAGING WITH IMPROVED HEAT DISSIPATION CAPABILITY

BACKGROUND OF INVENTION

1. Field of the Invention

The present invention relates generally to the field of semiconductor chip packaging and, more particularly, to chip scale packaging (CSP) with improved heat dissipation capability.

2. Description of the Prior Art

Chip scale packaging (CSP) has been introduced into the packaging industry for years to reduce overall volume of an electronic terminal product. CSP is typically referred to the post-package chip module, which is nearly the same size of the semiconductor chip such as a dynamic random access memory (DRAM) chip.

FIG. 1 demonstrates a sectional schematic view of a conventional chip scale packaging (CSP) module. As shown in FIG. 1, the conventional CSP module comprises a chip or die 10 that is adhered to a first side 15 of a packaging substrate 14 through an adhesive layer 12. The packaging substrate 14 has a central opening 16 exposing input/output pads 18 of the chip 10. Through the gold wires 19, the input/output pads 18 of the chip 10 are electrically connected to the corresponding bonding pads 20 disposed on the second side 17 of the packaging substrate 14. The input/output pads 18, gold wires 19, bonding pads 20 are protected with resin that fills the through hole 16. On the second side 17 of the packaging substrate 14, a number of solder balls 26 are implanted thereon. A resin passivation 32 seals the chip 10.

The above-described CSP module utilizes a single-layer packaging substrate 14. That is, metal pattern is merely formed on one side (the second side 17 in the case) of the packaging substrate 14, which is opposite to the packaged chip 10. No metal layer is formed on the other side (the first side 15) of the packaging substrate 14. Typically, the heat conductivity coefficient of the packaging substrate 14 is no more than 0.37 W/m° C. In operation, it becomes problematic because heat produced by the chip 10 cannot be efficiently dissipated through the packaging substrate 14 or a printed circuit board where the CSP module mounted.

In light of the above, there is a need in this industry to provide an improved CSP module with enhanced heat dissipation capability, thereby improving chip performance.

SUMMARY OF INVENTION

It is the primary object of the present invention to provide an improved CSP module to solve the above-mentioned problems.

According to the claimed invention, a chip scale packaging (CSP) module is provided. A packaging substrate comprising a first surface and a second surface opposite to the first surface is prepared. The packaging substrate has a plurality of metalized through holes communicating the first surface and the second surface, and a central opening for wire-bonding. A chip is adhered to the first surface of the packaging substrate with an adhesive layer. The chip comprises a plurality of first bonding pads exposed by the central opening and electrically connected to corresponding second bonding pads disposed on the second surface of the packaging substrate via metal wires. A plurality of peripheral heat-dissipating solder balls are implanted on the second surface of the packaging substrate. The heat-dissipating solder balls are connected to the metalized through holes such that heat produced by the chip can be transferred to a circuit board. A plurality of functional solder balls are implanted on the second surface of the packaging substrate and disposed substantially between the central opening and the peripheral heat-dissipating solder balls for signal communicating between the chip and the circuit board.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention pertains to an improved window BGA chip scale packaging module. The main purpose of the invention is to enhance the heat dissipation capability of the CSP module, thereby improving the performance of the chip.

Figure 1:
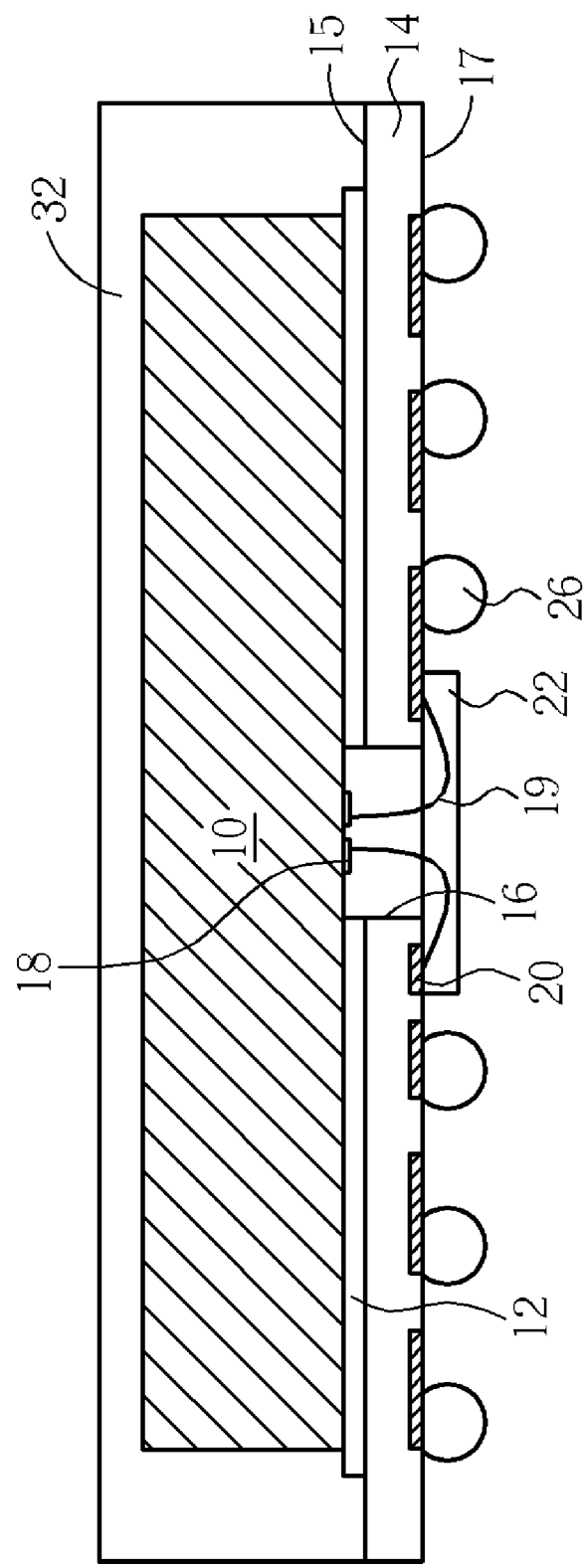
FIG. 1 is a sectional schematic diagram demonstrating a conventional chip scale packaging (CSP) module.
Figure 2:
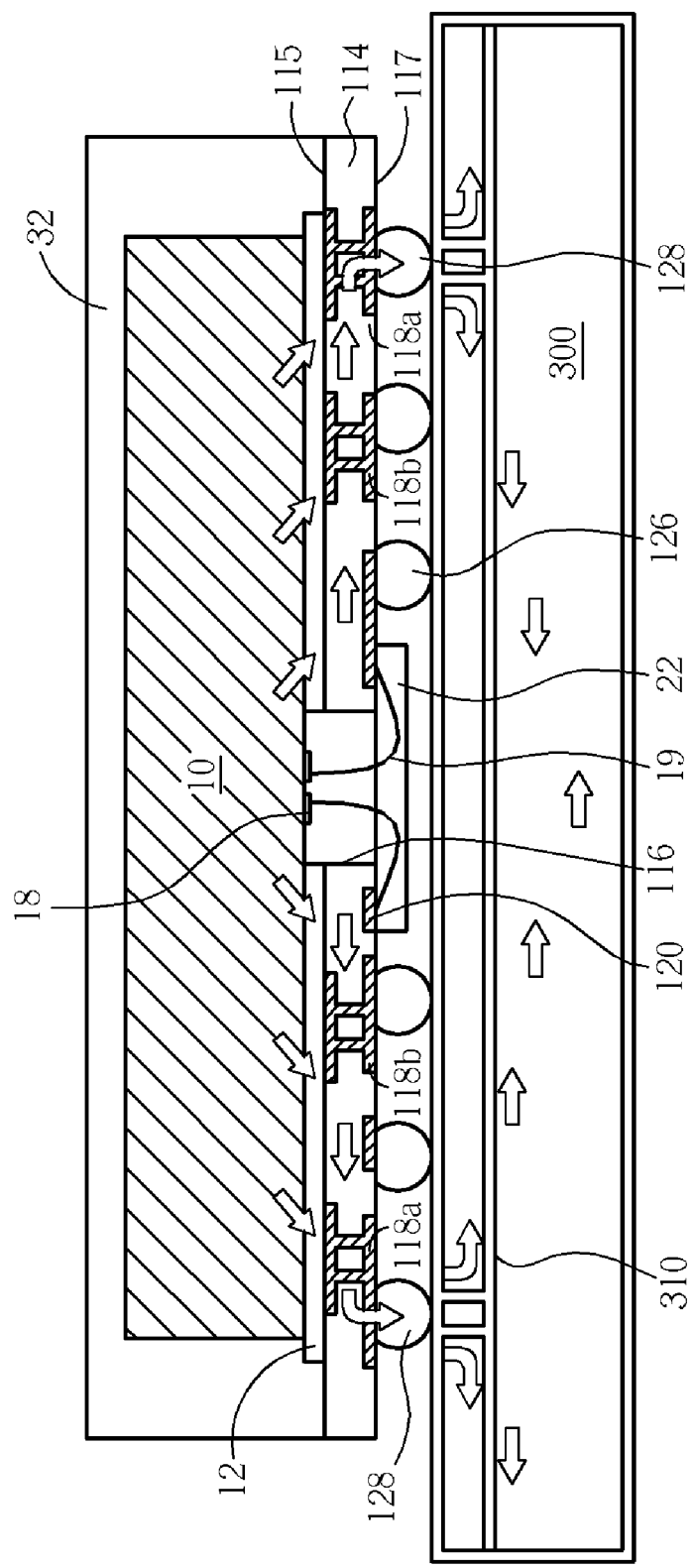
FIG. 2 is a schematic, cross-sectional diagram showing the improved CSP module according to the preferred embodiment of the present invention.

FIG. 2 is a schematic, cross-sectional diagram showing the improved CSP module according to the preferred embodiment of the present invention. As shown in FIG. 2, the present invention CSP module comprises a chip 10 that is adhered to a first surface 115 of a packaging substrate 114 with an adhesive layer 12. The adhesive layer 12 may be made of polyimide, epoxy or any suitable glue materials. The packaging substrate 114 has a central opening 116 exposing the input/output pads 18 of the chip 10. Through the gold wires 19, the input/output pads 18 of the chip 10 are electrically connected to the corresponding bonding pads 120 disposed on the second surface 117 of the packaging substrate 114. The input/output pads 18, gold wires 19, bonding pads 120 are protected with resin that fills the through hole 116.

On the second surface 117 of the packaging substrate 114, a number of functional solder balls 126 are implanted thereon for the communication with a printed circuit board 300. A number of heat-dissipating non-functional solder balls 128 are implanted on the periphery of the second surface 117 of the packaging substrate 114. Likewise, a resin passivation 32 seals the chip 10 for protection purposes.

According to the preferred embodiment, the packaging substrate 114 further comprises a plurality of metalized through holes 118a and 118b, wherein each of the metalized through holes 118a and 118b communicates the first surface 115 and the second surface 117 of the packaging substrate 114. The metalized through holes 118a are connected to corresponding heat dissipating solder balls 128. The metalized through holes 128b may be connected to the functional solder balls 128a. It is noted that each of the metalized through holes 118a and 118b are independent and is not electrically connected to any other through holes through the metal layers of the packaging substrate 114. The metallization of the through holes 118a and 118b may be accomplished by using any suitable copper deposition or plating methods.

The heat dissipation capability of the present invention CSP module can be significantly improved because the heat conductivity coefficient of copper is about 385 W/m° C., which is much greater than the heat conductivity coefficient of packaging substrate (~0.37 W/m° C.), and also much greater than the heat conductivity coefficient of tin (Sn: 50.9 W/m° C.). By providing the above-described CSP configuration, a heat dissipating path as specifically indicated with arrows in FIG. 2 is established. In operation, the heat produced by the chip 10 can be efficiently transferred via the heat dissipating path (metalized through holes-solder balls-printed circuit board), thereby improving the performance of the chip 10. Furthermore, the solder balls 128 can be connected to a grounded metal layer 310 of the underlying printed circuit board 300 to increase the heat dissipating surface area. From one aspect of this invention, the heat dissipating solder balls 128 may utilize grounding solder balls.

Figure 3:
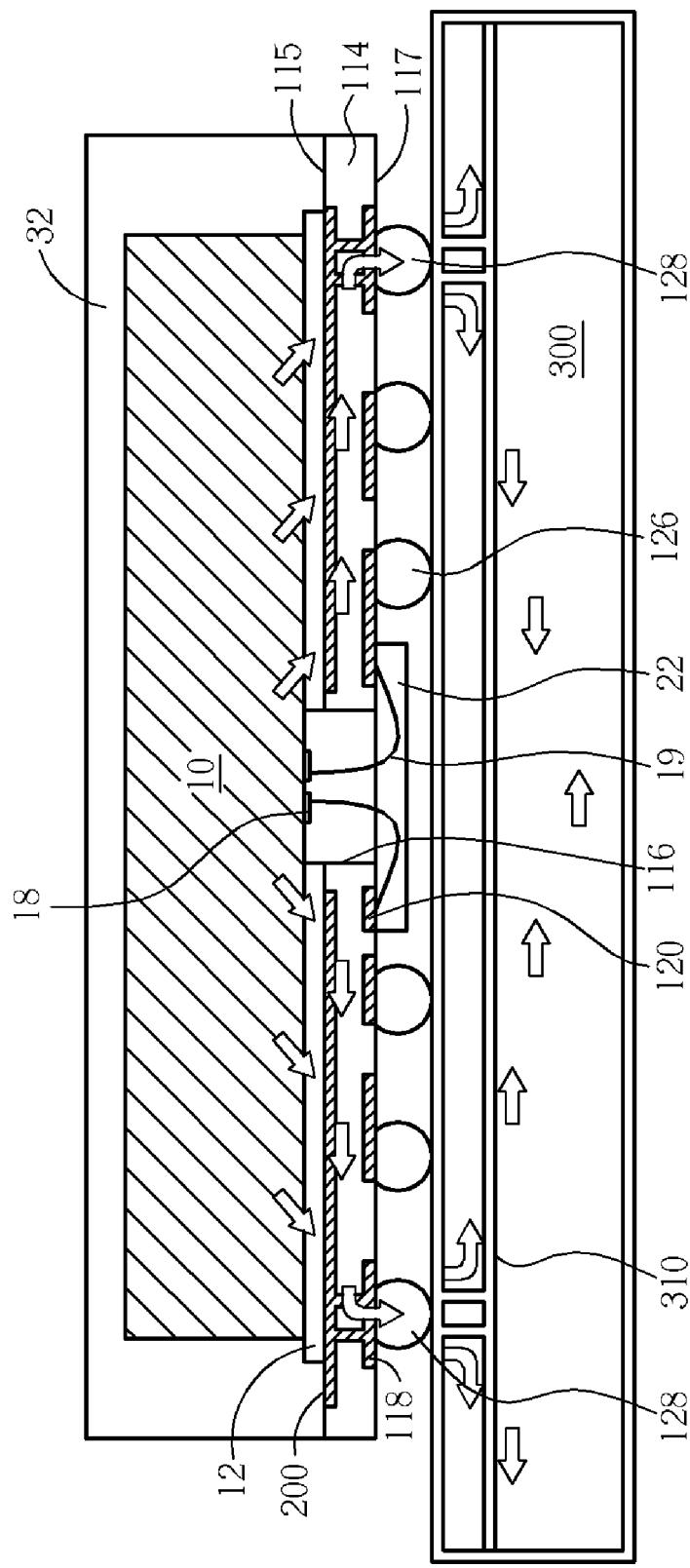
FIG. 3 is a schematic, cross-sectional diagram showing the improved CSP module according to another preferred embodiment of the present invention.

FIG. 3 is a schematic, cross-sectional diagram showing the improved CSP module according to another preferred embodiment of the present invention. As shown in FIG. 3, the CSP module of this preferred embodiment comprises a chip 10 that is adhered to a first surface 115 of a packaging substrate 114 with an adhesive layer 12. The packaging substrate 114 has a central opening 116 exposing the input/output pads 18 of the chip 10. Through the gold wires 19, the input/output pads 18 of the chip 10 are electrically connected to the corresponding bonding pads 120 disposed on the second surface 117 of the packaging substrate 114. The input/output pads 18, gold wires 19, bonding pads 120 are protected with resin that fills the through hole 116.

On the second surface 117 of the packaging substrate 114, a number of functional solder balls 126 are implanted thereon for the communication with a printed circuit board 300. A number of heat-dissipating non-functional solder balls 128 are implanted on the periphery of the second surface 117 of the packaging substrate 114. A resin passivation 32 seals the chip 10.

The packaging substrate 114 further comprises a heat dissipating metal plate 200 such as copper plate on its first surface 115. The packaging substrate 114 further comprises a plurality of metalized through holes 118, wherein each of the metalized through holes 118 communicates the first surface 115 and the second surface 117 of the packaging substrate 114. The metalized through holes 118 connected the metal plate 200 with the heat dissipating non-functional solder balls 128. The solder balls 128 can be connected to a grounded metal layer 310 of the underlying printed circuit board 300 to increase the heat dissipating surface area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A chip scale packaging (CSP) module, comprising:
   a packaging substrate comprising a first surface and a second surface opposite to said first surface, a plurality of metalized through holes communicating said first surface and said second surface, and a central opening for wire-bonding;
   a chip adhered to said first surface of said packaging substrate with an adhesive layer, wherein said chip comprises a plurality of first bonding pads exposed by said central opening and electrically connected to corresponding second bonding pads disposed on said second surface of said packaging substrate via metal wires;
   a heat-dissipating plate disposed directly underneath said chip and between said adhesive layer and said packaging substrate for collecting and transferring heat produced by said chip through conduction, wherein said heat-dissipating plate is connected to said metalized through holes;
   a plurality of heat-dissipating solder balls implanted on said second surface of said packaging substrate, wherein said heat-dissipating solder balls are connected to said metalized through holes such that heat produced by said chip can be transferred to a circuit board; and
   a plurality of functional solder balls implanted on said second surface of said packaging substrate and disposed substantially between said central opening and said peripheral heat-dissipating solder balls for signal communicating between said chip and said circuit board.

2. The chip scale packaging module according to claim 1 wherein said heat-dissipating solder balls are connected to a grounded metal layer of said circuit board.

3. The chip scale packaging module according to claim 1 wherein said through holes are metalized, simultaneously with said heat-dissipating plate, by using copper deposition or plating methods.

4. The chip scale packaging module according to claim 1 wherein said metal wires are gold wires.

5. The chip scale packaging module according to claim 1 wherein said central opening is filled with resin.

6. The chip scale packaging module according to claim 1 wherein said adhesive layer includes glue materials.

7. A chip scale packaging (CSP) module, comprising:
   a packaging substrate comprising a first surface and a second surface opposite to said first surface, a plurality of metalized through holes communicating said first surface and said second surface, and a central opening for wire-bonding;

a chip adhered to said first surface of said packaging substrate with an adhesive layer, wherein said chip comprises a plurality of first bonding pads exposed by said central opening and electrically connected to corresponding second bonding pads disposed on said second surface of said packaging substrate via metal wires;

a heat-dissipating metal plate disposed directly underneath said chip and between said adhesive layer and said packaging substrate for collecting and transferring heat produced by said chip through conduction, wherein said heat-dissipating plate is connected to said metalized through holes;

a plurality of heat-dissipating solder balls implanted on said second surface of said packaging substrate, wherein said heat-dissipating solder balls are connected to said metalized through holes such that heat produced by said chip can be transferred to a circuit board; and a plurality of functional solder balls implanted on said second surface of said packaging substrate and disposed substantially between said central opening and said peripheral heat-dissipating solder balls for signal communicating between said chip and said circuit board.

* * * * *